United States Patent [19]
Dick et al.

[11] Patent Number: 6,091,072
[45] Date of Patent: Jul. 18, 2000

[54] PIECE-WISE PROCESSING OF VERY LARGE SEMICONDUCTOR DESIGNS

[75] Inventors: Gregory J. Dick, Beacon; Joseph B. Frei, Hopewell Junction, both of N.Y.; Abigail S. Ganong, Sherman, Conn.; John G. Hartley, Fishkill; John W. Pavick, LaGrangeville, both of N.Y.

[73] Assignee: International Business Machines Corporation, Armonk, N.Y.

[21] Appl. No.: 08/956,825

[22] Filed: Oct. 23, 1997

[51] Int. Cl.$^7$ ............................................. H01J 37/302
[52] U.S. Cl. ........................... 250/492.22; 364/491
[58] Field of Search ..................... 250/492.22; 364/491

[56] References Cited

U.S. PATENT DOCUMENTS

| | | | |
|---|---|---|---|
| 4,816,692 | 3/1989 | Rudert, Jr. | 250/492.22 |
| 4,890,238 | 12/1989 | Klein et al. | 364/491 |
| 4,989,156 | 1/1991 | Ikenaga | 364/488 |
| 5,113,352 | 5/1992 | Finnerty | 364/490 |
| 5,294,800 | 3/1994 | Chung et al. | 250/492.22 |
| 5,493,509 | 2/1996 | Matsumoto et al. | 364/491 |
| 5,526,279 | 6/1996 | Dick | 364/491 |

FOREIGN PATENT DOCUMENTS 58-130524  8/1983  Japan ........................... 250/492.22

*Primary Examiner*—Jack I. Berman
*Attorney, Agent, or Firm*—Whitham, Curtis & Whitham; Jay H. Anderson

[57] ABSTRACT

A system and method of converting large Integrated Circuit (IC) designs into patterns. First, based on shape density, the design is fragmented into pieces, each piece including roughly the same number of shapes. Next, a band of shapes, all within the proximity correction area for each piece, are identified. Each piece, including its identified band, is processed individually to convert data within the piece and within the proximity correction band to Numerical Control (NC) data. The NC data for the proximity correction band is discarded. The piece's NC data is stored as an NC data file for the piece. This is repeated until all of the pieces are converted to NC data. Finally, the pattern is written, one piece at a time.

12 Claims, 6 Drawing Sheets

PIECE-WISE PROCESSING OF VERY LARGE SEMICONDUCTOR DESIGNS

BACKGROUND OF THE INVENTION

1. Field of the Invention

The present invention is related to integrated circuit fabrication and, more particularly, to lithographic patterning integrated circuit patterns by an energy beam exposure system.

2. Background Description

U.S. Pat. No. 5,294,800, entitled "E-Beam Control Data Compaction System and Method" to Chung et al., which is incorporated herein by reference, describes a system and method wherein Integrated Circuit (IC) chip designs of unlimited size are converted into tool control information for forming design patterns on mask layers or layers of a semiconductor wafer. Large chip designs were segmented into parcels of essentially equal data volume and the parcels were processed, independently, to create tool control information, called "Numerical Control data" (NC data). After each parcel was processed, the resulting processed data was combined with data from other parcels to form an NC data file that was used to control the electron beam (E-beam) tool writing the images.

The method taught in U.S. Pat. No. 5,294,800 was adequate for most repetitive chip designs, such as arrays, provided the NC data file generated did not exceed the file system or lithography tool limits. However, non-repetitive designs, such as a logic design may have few, if any, repetitive patterns with very little hierarchy to its data structure, i.e. it may be unnested ("flat") or contain very little nesting. These non-repetitive designs are, therefore, very large and result in very large NC data files. Often NC data files from these non-repetitive designs are larger than either the data processing system converting the data or the lithography tool can handle.

SUMMARY OF THE INVENTION

It is a purpose of the present invention to increase the complexity of integrated circuit designs.

It is another purpose of the present invention to form patterns for complex integrated circuit designs.

It is yet another purpose of the present invention to form patterns for complex integrated circuit designs without increasing the cost of the lithography tool.

The present invention is a system and method of converting large IC designs into manageable pieces. First, based on shape density, the design is fragmented into pieces, each piece including roughly the same number of shapes. Next, a band of shapes, all within the proximity correction area are identified for each piece. Each piece, including its identified band, is processed to convert data within the piece and within the proximity correction band to NC data. The NC data for shapes within the proximity correction band is discarded. The remaining NC data is stored as an NC data file. This is repeated until each piece is stored as an NC data file. Finally, each piece of the pattern is written, one field at a time.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
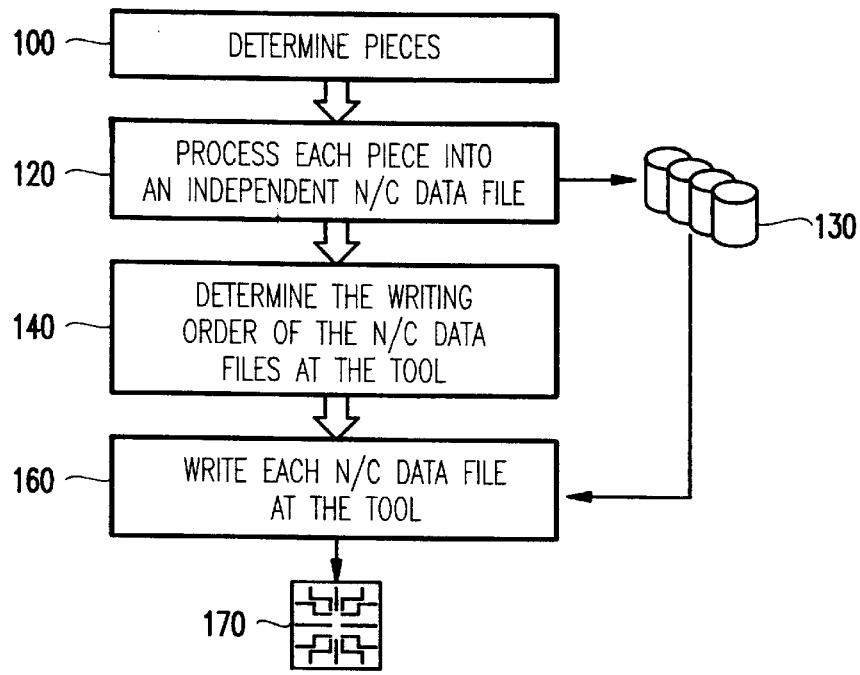
FIG. 1 is a flow diagram of the preferred embodiment method of converting large IC designs into manageable pieces.

FIG. 1 is a flow diagram of the preferred embodiment method of the present invention wherein large IC designs are converted into manageable pieces. First, in step 100, based on shape density, the design is fragmented into pieces, each piece including roughly the same number of shapes. In step 120, NC data is generated for each piece, individually, first by identifying a band of shapes, all within the proximity correction area around each piece, and, then, processing each piece, with its identified band, converting shape data within the piece and its proximity correction band to NC data. Then, the NC data for shapes within the proximity correction band is discarded. The remaining NC data is stored in storage 130 as NC data for the piece. Step 120 is repeated until the processing of the entire design is complete, converting every piece to NC data and storing the converted pieces in storage 130. In step 140, the pieces are sorted for writing according to tool dependent criteria. Finally, in step 160, each piece of the design is written to form the pattern 170.

Figure 2:
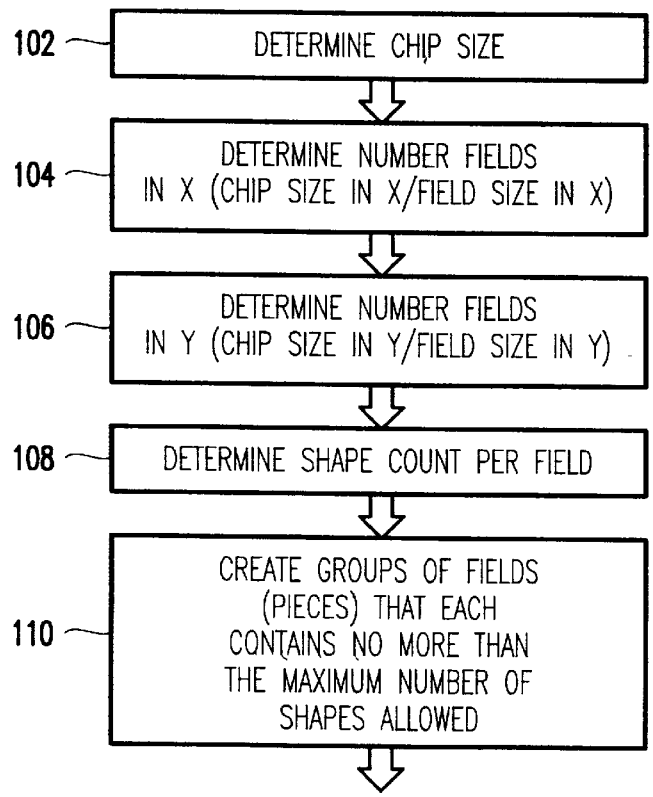
FIG. 2 is a flow diagram of the first step of fragmenting the design into pieces.
Figure 3A:
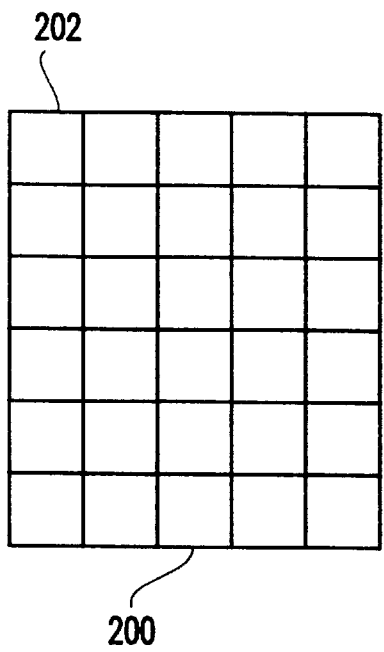
FIG. 3A is a representation of a design divided into fields.

FIG. 2 is a flow diagram of the step 100 of fragmenting the design into pieces. First, in step 102, chip dimensions are determined. Next, in step 104, the design is divided, horizontally, into fields and, in step 106, vertically. FIG. 3A is a representation of a design 200 divided into five horizontal by six vertical fields 202. In step 108, the number of shapes in each field is counted.

Figure 3B:
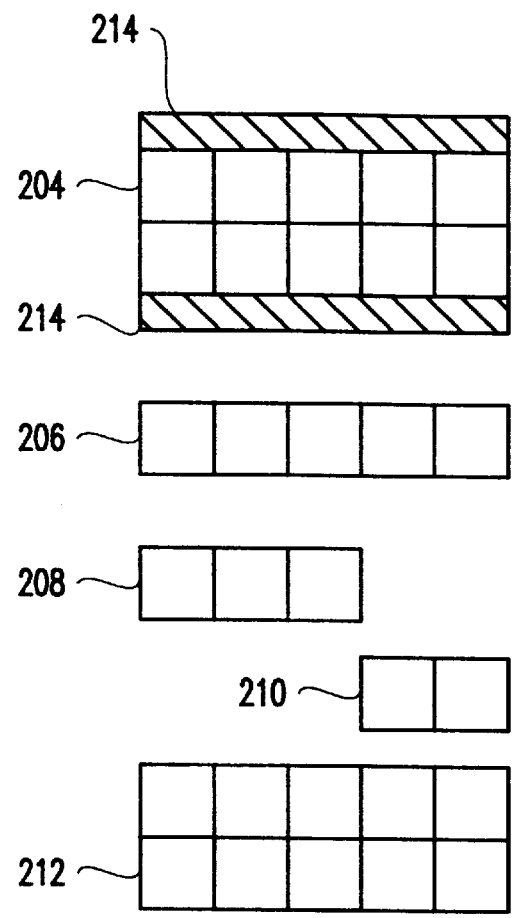
FIG. 3B shows the fields of FIG. 3A grouped into pieces.

In step 110, as represented in FIG. 3B, the fields 202 are grouped into pieces, in this example 204, 206, 208, 210 and 212. The resulting number of pieces 204–212 depends on the number of shapes in each of the respective fields 202. Each piece 204–212 is limited to a maximum number of shapes, so the fields 202 are grouped such that each piece 204–212 contains less than the maximum. As a result, each piece 204–212 may be one field 202 or a group of two or more fields 202.

There are several factors that determine that maximum number. These factors include the lithography tool's file system and the file system of the data processing system operating on the data. Clearly, the file systems handling the generated NC data must be capable of handling the volume of data generated.

Figure 4:
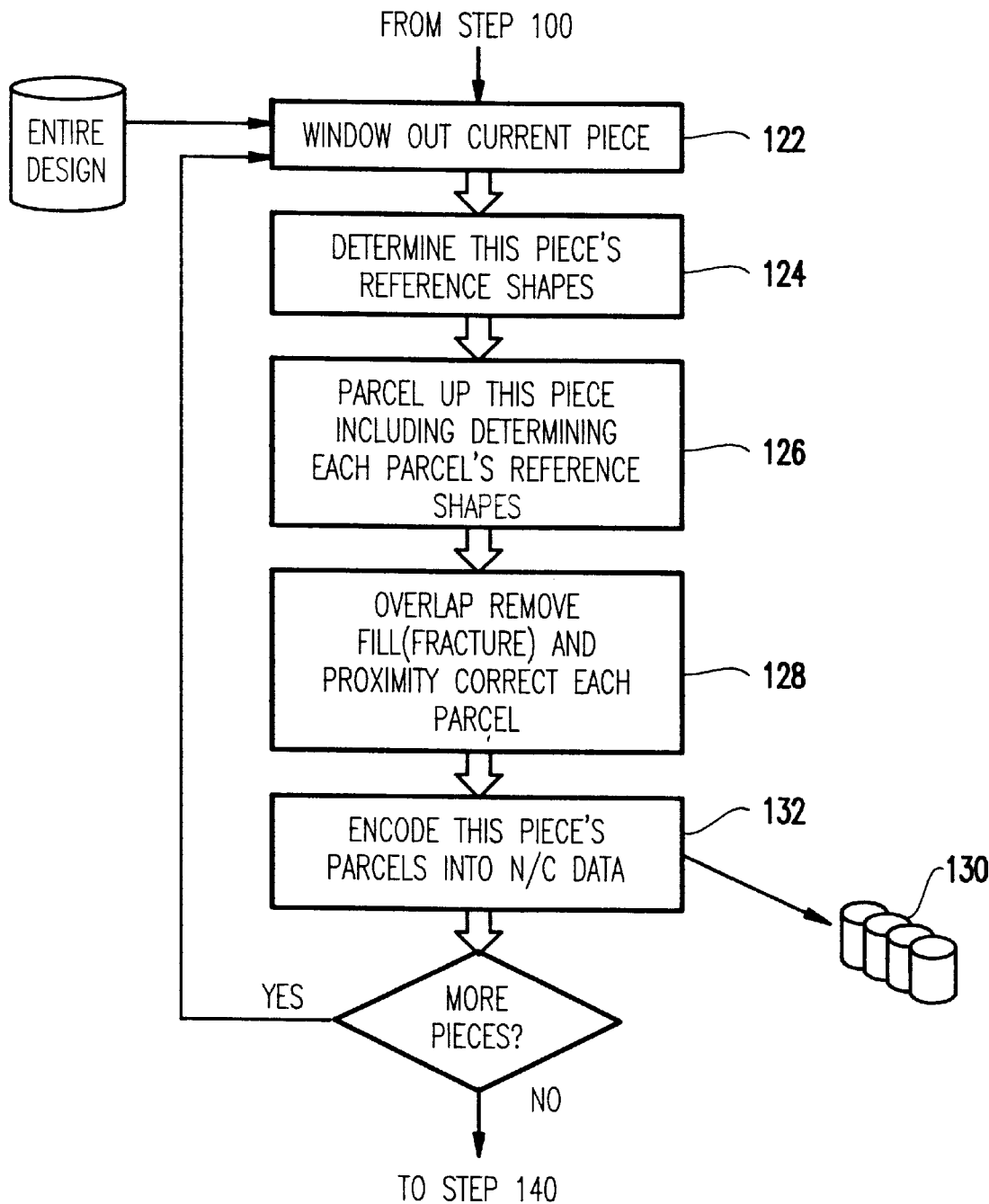
FIG. 4 is a flow diagram of the step 120 of converting the pieces to NC data.

FIG. 4 is a flow diagram of the step 120 of converting the pieces to NC data. In this step 120 each piece 204–212 is treated as if it were an individual design. Thus, in step 122, each of the individual pieces 204–212 is selected, one at a time. Then, in step 124, the shapes in the proximity correction band 214 are identified for the selected piece, e.g., 204, allowing the piece 204 to be processed as an independent design. To manage the shapes in the piece 204–212, in step 126, the shapes in the selected piece 204 are parceled into manageable parcels, such as described in U.S. Pat. No. 5,294,800. It should be noted that any shapes in the proximity band 214 are for reference only, i.e., solely for the purpose of calculating proximity correction values for shapes around the piece's perimeter and not encoded with the piece 204. This is different from parceling within the piece 204–212 as taught in U.S. Pat. No. 5,294,800, wherein each parcel includes proximity correction reference shapes that are shapes in another parcel.

In step 128, the parceled data is prepared for conversion to NC data. This preparation may include unioning shapes in the parcel, filling the unioned shapes, proximity correction and gray splicing, depending upon the target lithography tool requirements. Then, in step 132, each parcel is encoded as NC data which is stored in an NC data file 130 for the piece being processed. Steps 122–132 are repeated until every piece is encoded as a separate NC data in file 130.

Figure 5:
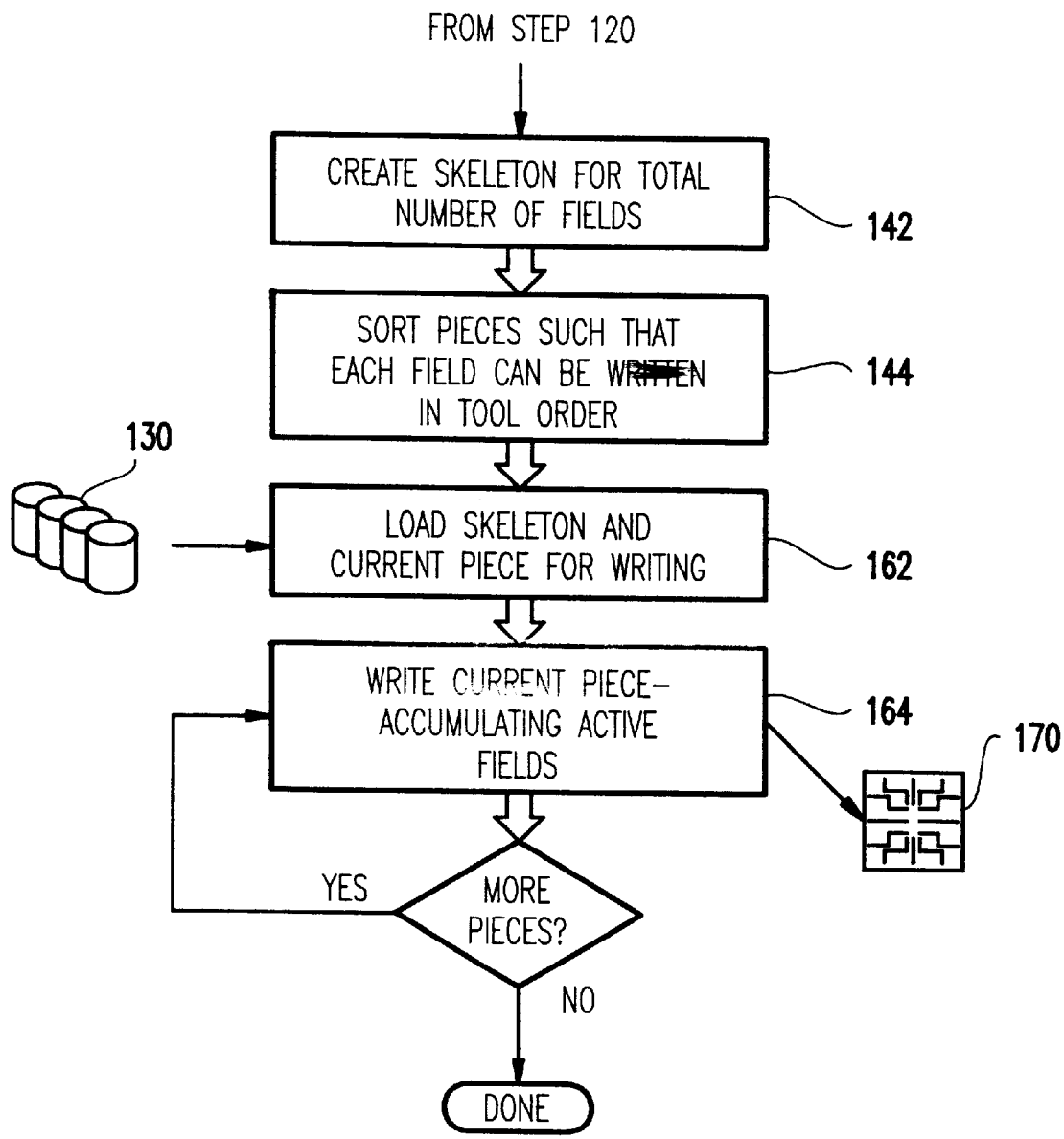
FIG. 5 is a flow diagram of steps of determining the writing order of the pieces and writing the pieces to form the pattern.

Next, in FIG. 5, which is a flow diagram of steps 140 and 160, the writing order of the pieces is determined and the pieces are written to form the pattern. So, in step 142, to determine the writing order, a skeleton is formed of the entire design that identifies the location of each field 202. Then, in step 144, based on any tool specific requirements, the piece 204–212 order is determined.

Thus, having completed step 140, the NC data for each piece of the entire design is passed from file 130 to the lithography tool in the determined order and the patterned formed. So, in step 162, the skeleton, which for visualization purposes may be represented by the field arrangement of FIG. 3A, is loaded into the lithography tool and the tool is loaded with NC data for the first piece, e.g., 204. Each piece 204–212 is treated by the lithography tool as being the entire design with shapes only in the piece, e.g., 204, and the rest of the skeleton empty. The loaded NC data is written in step 164. Remaining pieces 206–212 are loaded and written in order repeating steps 162 and 164 until the entire pattern is complete.

Figure 6A:
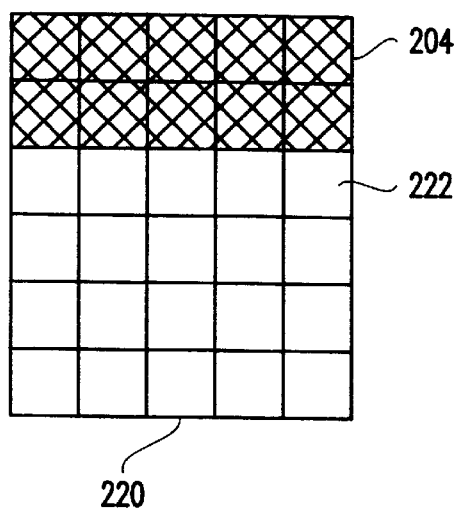
FIGS. 6A–F shows each piece of the design being loaded and written to chip pattern area.
Figure 6B:
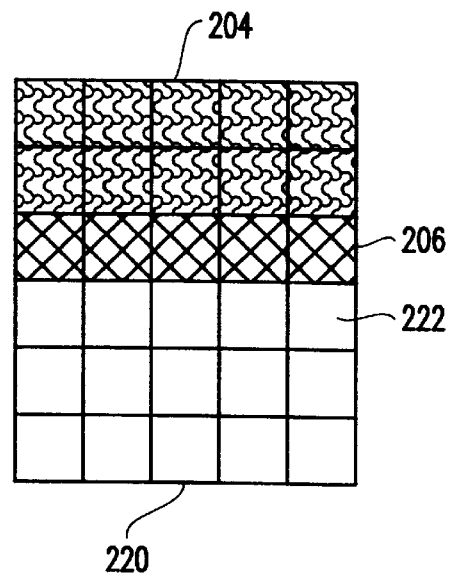
Figure 6C:
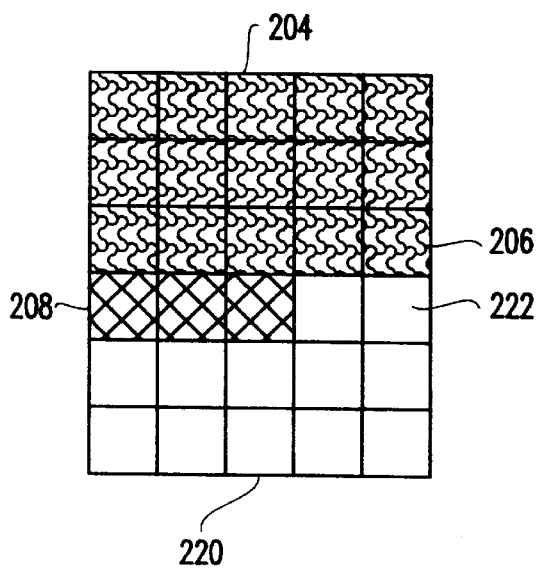
Figure 6D:
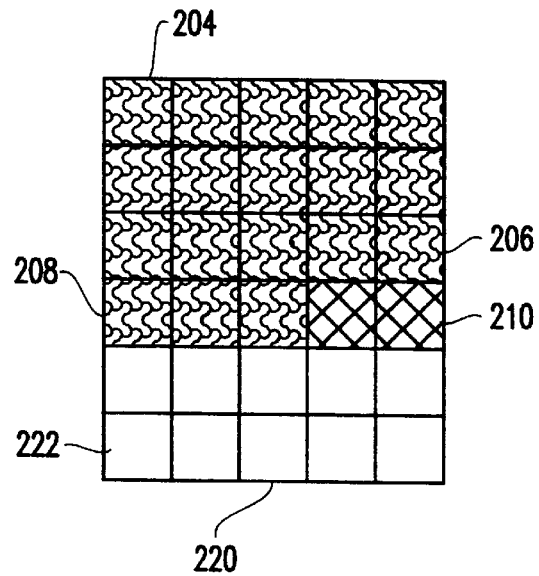
Figure 6E:
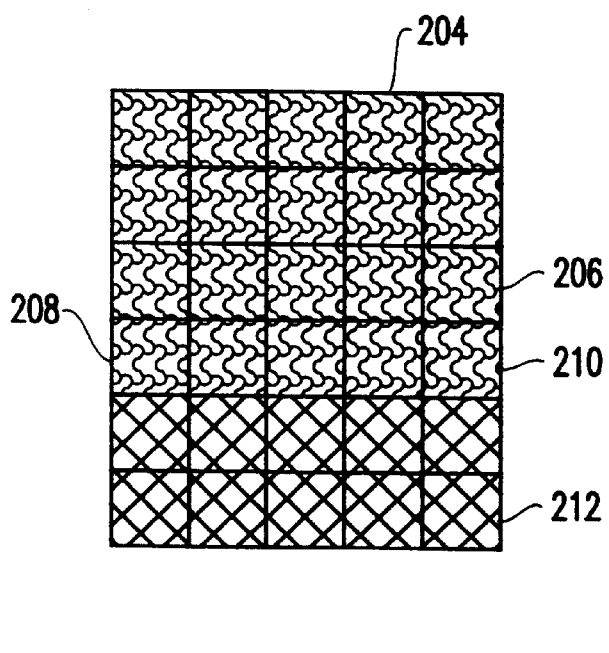
Figure 6F:
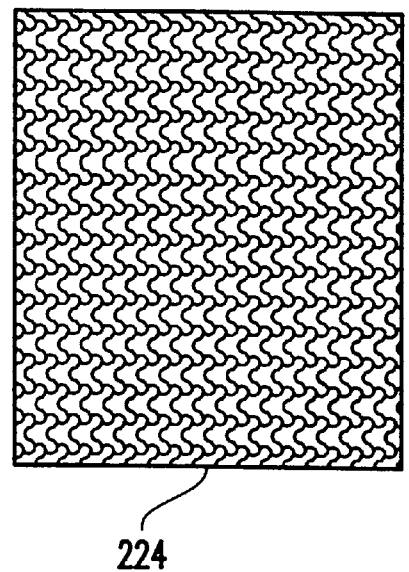

FIGS. 6A–F represent loading and writing each piece 204–212 of design 200 to chip pattern area 220. In FIG. 6A, piece 204 is written, as represented by the cross hatching, with the remaining chip area, represented by clear fields 222, vacant. In FIG. 6B, the pattern is complete in piece 204, and piece 206 is written. Both piece 204 and the remaining chip areas 222 are treated as vacant. In FIG. 6C, the pattern is complete in pieces 204 and 206, while piece 208 is written. Written pattern pieces 204, 206 and the remaining chip areas 222 are treated as vacant. In FIG. 6D, the pattern is complete in pieces 204, 206 and 208, while piece 210 is written. Again, written pattern pieces 204, 206, 208 and the remaining chip areas 222 are treated as vacant. Finally, in FIG. 6E, the pattern is complete in pieces 204, 206, 208 and 210, while final piece 212 is written. At this point, only written pattern pieces 204, 206, 208 and 210 are treated as vacant. FIG. 6F shows the complete pattern 224.

While the invention has been described in terms of preferred embodiments, those skilled in the art will recognize that the invention can be practiced with modification within the spirit and scope of the appended claims.

We claim:

1. A method of converting a design into a pattern, said method comprising the steps of:

a) dividing a design into a plurality of pieces;

b) converting each of said pieces into numerical control for controlling a lithography tool;

c) determining a writing order for said converted pieces; and d) writing each of said plurality of pieces in said determined order, said numerical control controlling said lithography tool to write each said piece.

2. The method of claim 1 wherein the step (a) of dividing the design comprises the steps of:

1) determining a size of said design;

2) dividing said design into a plurality of fields;

3) determining a shape count for each of said plurality of fields; and 4) grouping said plurality of fields into said plurality of pieces, each of said plurality of pieces having fewer shapes than a predetermined maximum.

3. The method of claim 2 wherein the step (2) of dividing the design comprises dividing the design into an array of fields of equal size.

4. The method of claim 1 wherein the step (b) of converting the pieces comprises the steps of:

1) selecting one of said plurality of pieces and providing said selected piece with an overlap band around its perimeter;

2) parceling said selected piece into a plurality of parcels;

3) discarding said overlap band;

4) encoding said plurality of parcels as a numerical control file for said lithography tool; and 5) repeating steps 1–4 until each of said plurality of pieces have been encoded as numerical control.

5. The method of claim 4 wherein the step (1) of selecting one of said pieces and providing the overlap band comprises:

i) identifying fields within the design grouped in said selected one piece;

ii) identifying shapes in fields adjacent to said identified fields and within a predetermined distance from shapes in said identified fields; and iii) copying said identified shapes into overlap band.

6. The method of claim 5 wherein said copied shapes in said overlap band are used for proximity correction of shapes within said piece.

7. The method of claim 1 wherein the step (c) of determining the writing order comprises the steps of:

1) creating a chip skeleton for the chip; and 2) sorting said plurality of pieces.

8. The method of claim 7 wherein the step (d) of writing each of said pieces comprises the steps of:

1) loading said skeleton into said lithography tool;

2) loading one said piece's numerical control file;

c) writing one said piece, said lithography tool being controlled by said piece's numerical control file to write said one piece; and d) repeating steps b and c until each of said plurality of pieces are written.

9. A method of controlling a lithography tool in writing a design pattern, said method comprising the steps of:

a) determining a size of said design;

b) dividing said design into a plurality of fields;

c) determining a shape count for each of said plurality of fields;

d) grouping said plurality of fields into said plurality of pieces, each of said plurality of pieces having fewer shapes than a predetermined maximum;

e) converting each of said pieces into numerical control for controlling said lithography tool;

f) determining a writing order for said converted pieces; and g) writing each of said plurality of pieces in said determined order, said numerical control controlling said lithography tool to write each said piece.

10. The method of claim 9 wherein the design is divided into an array of equal sized fields and step (e) of converting the pieces comprises the steps of:

1) selecting one of said plurality of pieces and providing said selected piece with an overlap band around its perimeter, said overlap band including copies of shapes within a predetermined distance in fields adjacent said selected piece;

2) parceling said selected piece into a plurality of parcels;

3) discarding said overlap band;

4) encoding said plurality of parcels as a numerical control file for said lithography tool; and 5) repeating steps 1–4 until each of said plurality of pieces have been encoded as numerical control.

11. The method of claim 10 wherein the step (f) of determining the writing order includes creating a chip skeleton for the chip and the step (g) of writing each of said pieces comprises the steps of:

1) loading said skeleton into said lithography tool;

2) loading one said piece's numerical control file;

3) writing one said piece, said lithography tool being controlled by said piece's numerical control file to write said one piece; and 4) repeating steps b and c until each of said plurality of pieces are written.

12. The method of claim 10 wherein said copies of shapes in said overlap band are used for proximity correction of shapes within said piece.

* * * * *